(12) United States Patent
Tai et al.

(10) Patent No.: US 8,338,867 B2
(45) Date of Patent: Dec. 25, 2012

(54) HIGHLY SENSITIVE PHOTO-SENSING ELEMENT AND PHOTO-SENSING DEVICE USING THE SAME

(75) Inventors: Mitsuharu Tai, Kokubunji (JP); Hideo Sato, Hitachi (JP); Mutsuko Hatano, Kokubunji (JP); Masayoshi Kinoshita, Hachioji (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 13/236,338

(22) Filed: Sep. 19, 2011

(65) Prior Publication Data

US 2012/0068287 A1    Mar. 22, 2012

Related U.S. Application Data

(62) Division of application No. 11/956,551, filed on Dec. 14, 2007, now abandoned.

(30) Foreign Application Priority Data

Dec. 18, 2006  (JP) ................................ 2006-339745

(51) Int. Cl.
H01L 31/062   (2012.01)
(52) U.S. Cl. ................ 257/290; 257/E31.085
(58) Field of Classification Search .................. 257/290, 257/E31.085
See application file for complete search history.

(56) References Cited

U.S. PATENT DOCUMENTS

| | | | |
|---|---|---|---|
| 5,644,146 | A | 7/1997 | Arai et al. |
| 6,884,664 | B2 | 4/2005 | Fujimoto et al. |
| 7,132,685 | B2 | 11/2006 | Chen |
| 7,361,947 | B2 | 4/2008 | Tada |
| 2004/0051142 | A1 | 3/2004 | Yamazaki et al. |
| 2005/0199876 | A1 | 9/2005 | Matsumoto |
| 2006/0138421 | A1 | 6/2006 | Tada |

FOREIGN PATENT DOCUMENTS

JP   2006-003857   1/2006

OTHER PUBLICATIONS

Kazuhiro Maeda, et al., System—LCD With Monolithic Ambient-Light Sensor System, Sharp Technical Journal, Accepted on Jun. 13, 2005, vol. 92.
Robert Street, Large Area Image Sensor Arrays, Technology and Applications of Amorphous Silicon, pp. 204-221.
Examiner's Opinion Summary in counterpart Taiwanese Patent Application, pp. 1-2.

*Primary Examiner* — Jerome Jackson, Jr.
*Assistant Examiner* — Yu Chen
(74) *Attorney, Agent, or Firm* — Antonelli, Terry, Stout & Kraus, LLP.

(57) ABSTRACT

According to the present invention, a highly sensitive photo-sensing element and a sensor driver circuit are prepared by planer process on an insulating substrate by using only polycrystalline material. Both the photo-sensing element and the sensor driver circuit are made of polycrystalline silicon film. As the photo-sensing element, a photo transistor is formed by using TFT, which comprises a first electrode 11 prepared on an insulating substrate 10, a photoelectric conversion region 14 and a second electrode 12, and a third electrode 13 disposed above the photoelectric conversion region 14. An impurity layer positioned closer to an intrinsic layer (density of active impurities is $10^{17}$ cm$^{-3}$ or lower) is provided on the regions 15 and 16 on both sides under the third electrode 13 or on one of the regions 15 or 16 on one side.

6 Claims, 11 Drawing Sheets

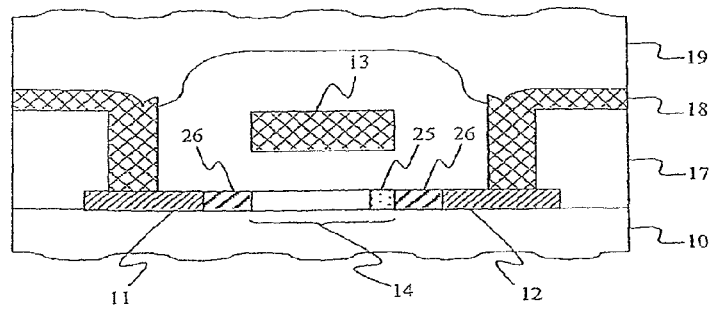
FIG.2A
PRIOR ART
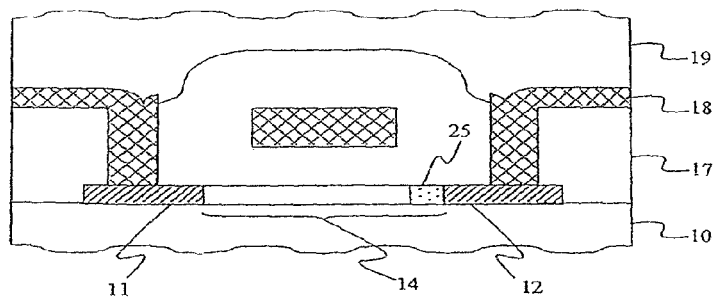
FIG.2B
FIG.3
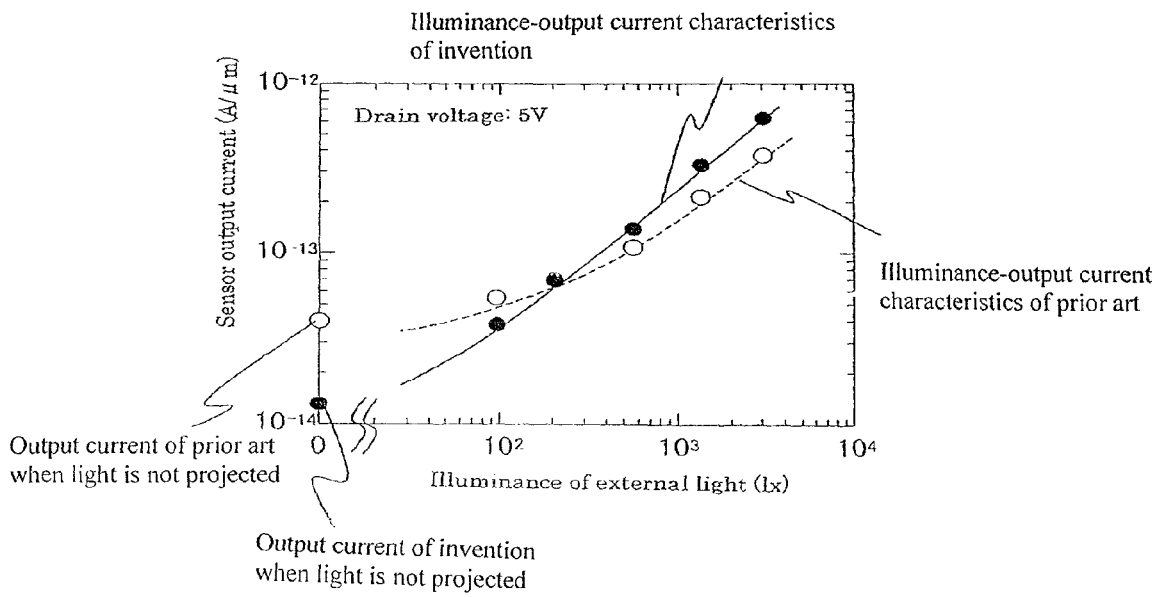

FIG. 4
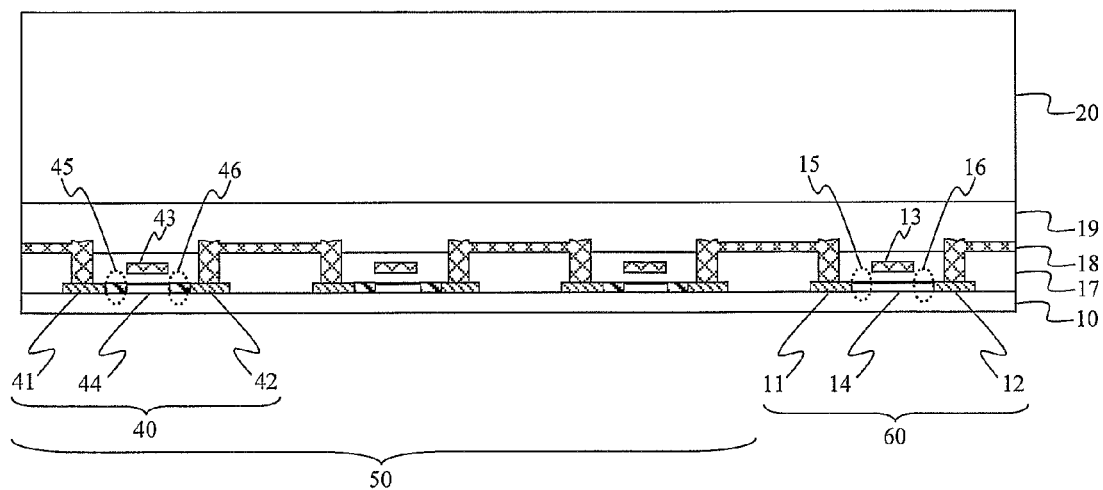
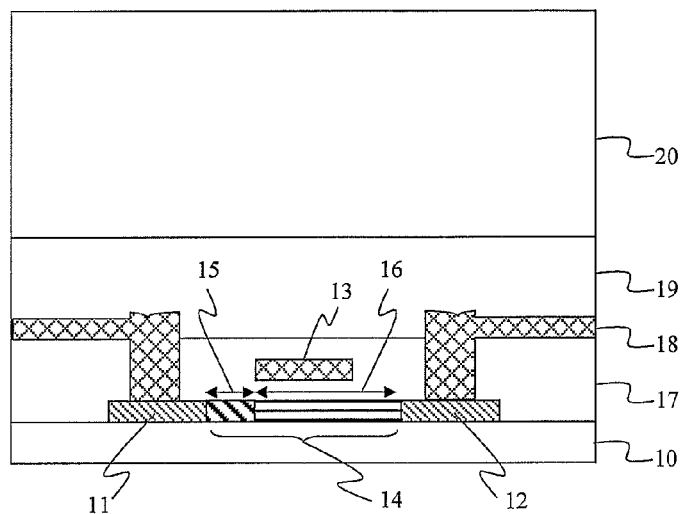
FIG. 5A
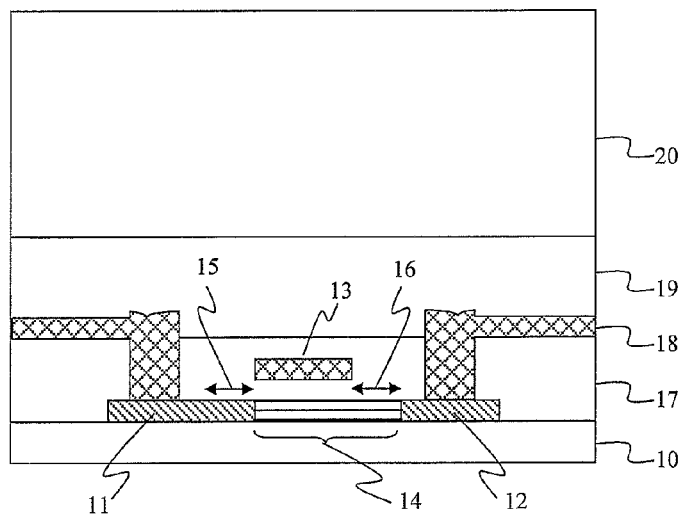
FIG. 5B (6)

(7)

(8)

(9)

701   702   703

FIG. 10A
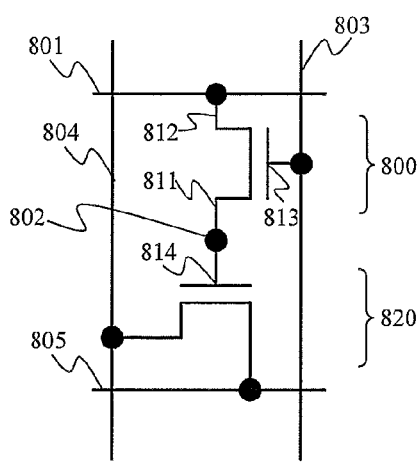
FIG. 10B
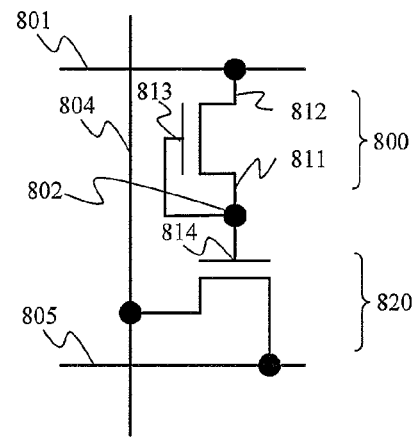
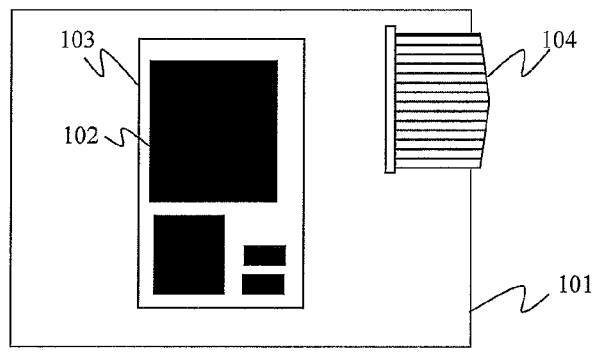
FIG. 11A
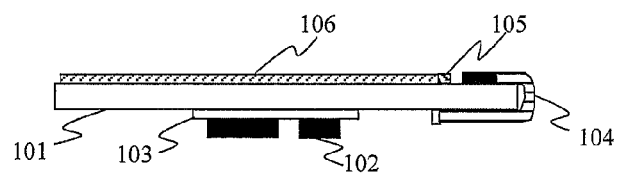
FIG. 11B
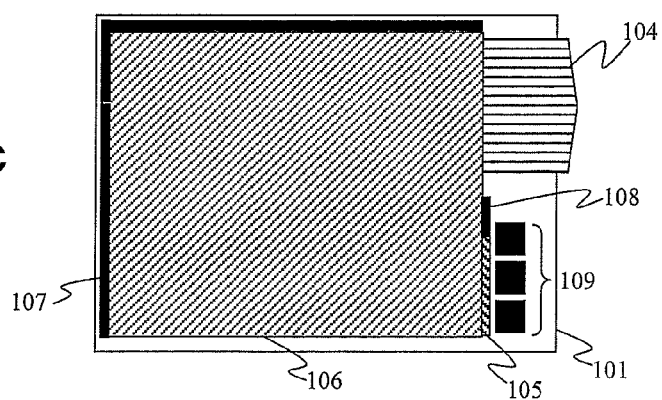
FIG 11C

HIGHLY SENSITIVE PHOTO-SENSING ELEMENT AND PHOTO-SENSING DEVICE USING THE SAME

CROSS-REFERENCE TO RELATED APPLICATIONS

This application is a divisional application of U.S. application Ser. No. 11/956,551, filed Dec. 14, 2007, the entire contents of which is incorporated herein by reference.

BACKGROUND OF THE INVENTION

1. Field of the Invention

The present invention relates to a thin-film photo-sensing element formed on an insulating film substrate and to a photo-sensing device using the same. In particular, the invention relates to an optical sensor array such as an X-ray imaging device, a near-infrared light detector for biometrics, etc. and an image display unit integrated with a display panel with touch panel function, ambient light detecting function, and input function using photo-sensor, e.g. low temperature process semiconductor thin-film transistor used in liquid crystal display, organic electroluminescence display, inorganic electroluminescence display, and electro chromic display, and low temperature process photoconductive element or low temperature process photo-diode element.

2. Description of the Prior Art

X-ray imaging device is now indispensable as a medical treatment device, and there are strong and continuous demands to simplify the operation of the device and to produce it at lower cost. Also, in recent years, special notice has been given on the means for biometrics to obtain information from finger vein or palm vein, and it is an imminent problem to have a device or a system for reading the information of this type. In such device or system, a sensor array for optical detection in a certain area, i.e. the so-called area sensor, for reading these types of information, and this area sensor must be provided at lower cost. To satisfy these requirements, a method has been proposed in the Non-Patent Document 1 as given below, according to which an area sensor is prepared by semiconductor forming process (planer process) on an inexpensive insulating substrate typically represented by glass substrate.

In the field of the products different from the area sensor, the photo-sensor is also required on a medium-to-small size display. The medium-to-small size display is applied for display purpose in mobile devices such as handy phone, digital still camera, PDA (personal digital assistant), or display on board. Multiple functions and high performance characteristics are required on these types of devices and systems. Attention is now focused on the photo-sensor as effective means for adding ambient light detecting characteristics (see the Non-Patent Document 2 given below) and touch panel functions. However, unlike the large size display, panel cost is low in the medium-to-small size display. This means that the cost is increased for mounting the photo-sensor or the sensor driver. Therefore, when a pixel circuit is prepared on a glass substrate by semiconductor forming process (planer process), special notice is now given on the technique to prepare the photo-sensor or the sensor driver and on the method to manufacture them at lower cost.

The important issues in the groups of products as described above are to prepare a photo-sensing element or a sensor driver on an inexpensive insulating substrate. The sensor driver typically comprises LSI, and it usually requires MOS transistor deposited on monocrystalline silicon wafer or a switching element with high performance characteristics of similar type. To solve such problems, the technique as described below seems to be essential.

As pixel and pixel driver circuit element for an active matrix type liquid crystal display, an organic electroluminescence display, or an image sensor, the thin-film transistor (hereinafter referred as "polycrystalline semiconductor TFT") has been developed, which is made up by polycrystalline semiconductor. Compared with other types of driver circuit elements, the polycrystalline semiconductor TFT is advantageous in that it has higher driving ability. Peripheral driver circuit can be prepared on the same glass substrate as pixel. As a result, this is convenient for attaining the customization of circuit specification and low cost production by simultaneously performing pixel designing and preparation process and for achieving high reliability by avoiding mechanical fragility of the connections of the driving LSIs and pixels.

The polycrystalline semiconductor TFT for liquid crystal display is prepared on a glass substrate for the purpose of reducing the manufacturing cost. In the process to prepare TFT on the glass substrate, process temperature is determined by heat-resistant temperature of the glass. As a method to prepare polycrystalline semiconductor thin-film of high quality without giving thermal damage to the glass substrate, ELA method (excimer laser annealing method) is known, according to which the semiconductor layer is molten and re-crystallized. The polycrystalline semiconductor TFT obtained by this method has driving ability more than 100 times as high as that of TFT (with the channel made of amorphous semiconductor) as used in the conventional type liquid crystal display, and some of the circuits such as driver circuit can be mounted on the glass substrate.

With regard to the photo-sensor, a method to use the polycrystalline semiconductor TFT and a method to use a PIN type diode in addition to pixel circuit and driver circuit are described in the Patent Document 1 as given below. The characteristics required for the photo-sensor are high sensitivity and low noise. If it is limited to the important characteristics of the photo-sensing element, "high sensitivity" means to issue as high signal as possible with respect to a light with certain intensity. This means that a material and an element structure with high light-to-current conversion efficiency are required. "Low noise" means that the signal is as low as possible when the light is not projected.

FIG. 12 represents cross-sectional views each showing a conventional type photo-sensing element. FIG. 12 (a) shows a PIN type diode element of vertical structure using amorphous silicon layer as a photoelectric conversion layer 113. FIG. 12 (b) shows a TFT element of lateral structure, which uses amorphous silicon film as the photoelectric conversion layer 113 and in which electric charge flows in parallel to the connected surface. Both of these serve as photo-sensing elements.

The photo-sensing element as shown in FIG. 12 (a) comprises a photoelectric conversion layer 113 of amorphous silicon film interposed between a first metal electrode layer 111 and a second metal electrode layer 112, and an impurity induced layer 120, which is prepared between the photoelectric conversion layer 113 and each of the electrode layers. This photo-sensing element is disposed on an insulating substrate 110. Each of the electrode layers is connected to an electrode line 114 insulated by an interlayer insulating film 115 and is covered with a passivation film 117.

The photo-sensing element shown in FIG. 12 (b) comprises a source electrode 131, a gate electrode 132, a drain electrode 133, a gate insulating film 134 and a photoelectric conversion layer 113 made of amorphous silicon film. Further, it comprises an impurity induced layer 120 disposed on boundary surface between the photoelectric conversion layer 113 and each of the electrodes. This photo-sensing element is mounted on the insulating substrate 110 and is covered with a passivation film 117.

In FIG. 12, as a semiconductor material to be used in the photoelectric conversion layer 113 of the sensor element disposed on the insulating substrate 110, a silicon type material such as silicon, silicon-germanium, etc. should be used because due consideration must be given on environmental problem or process coordination when driver circuit (or pixel circuit) is formed at the same time. When the silicon type material is used, among the light components absorbed in the wavelength range from infrared light to visible light, almost all of the light components are converted to electric current. This means that a material having higher absorption coefficient is suitable as the material for the photo-sensing element.

Also, when attention is given on solid phase status (hereinafter referred as "phase status") of semiconductor such as amorphous, crystalline or polycrystalline semiconductor, absorption coefficient of the amorphous material is at the highest for the entire wavelength range and this has high resistance. In this respect, amorphous material is advantageous and suitable as the material of the sensor element.

However, when the amorphous material is used in the sensor element, the performance characteristics of the switching element are not sufficient, and it is not possible to have the driver circuit at the same time. For instance, when TFT is made of amorphous silicon material, which is optimal as the material for the sensor element, field effect mobility is 1 $cm^2/Vs$ or lower. For this reason, high sensor characteristics can be attained by preparing the sensor array as the structure shown in FIG. 12, while switching characteristics can be provided by mounting the driver LSI and by connecting via the means such as FPC.

When the material is monocrystalline, it is possible to make up the sensor element and the circuit at the same time. This manufacturing process is a process requiring the temperature as high as 1000° C. or higher. Thus, it cannot be prepared on an inexpensive insulating substrate such as glass substrate.

When the switching element and the sensor element to constitute the driver circuit are made of polycrystalline semiconductor film, the driver circuit (and also, pixel circuit) and the sensor element can be prepared at the same time on the same insulating substrate. In case of the polycrystalline semiconductor film produced by ELA method, TFT with high quality can be obtained, which can be used for the driver circuit.

[Non-Patent Document 1] "Technology and Applications of Amorphous Silicon; pp. 204-221.
[Non-Patent Document 2] SHARP Technical Journal, Vol. 92 (2005); pp. 35-39.
[Patent Document 1] JP-A-2006-3857.

SUMMARY OF THE INVENTION

When the PIN type diode described in the Patent Document 1 is compared with an amorphous vertical (laminated) type element, the former is lower in sensitivity than the latter but has higher sensitivity among the sensor elements made of polycrystalline film. However, intrinsic region (I region), P region and N region must be separately provided, and this means that the number of photo-masks and the number of processes are increased. This results in higher manufacturing cost compared with other types of sensor elements.

As another type of sensor element prepared by using polycrystalline semiconductor film, TFT is known. Because the structure is the same as that of the switching element, which makes up the circuit, it is advantageous in that the number of processes can be decreased and the manufacturing cost can be reduced. However, there are problems in the maintenance and the improvement of sensitivity of the element. Normally, in the channel region, which serves as photoelectric conversion region, thin impurity layer is introduced for the control of threshold voltage. As a result, the depletion region is short, and service life of the electron-hole pair is shortened. Accordingly, the photocurrent to be detected is low, and the sensitivity is worsened. Also, when the gate is positioned closer to the photoelectric conversion surface with respect to the channel, the sensitivity is reduced further due to the light shielding effect of the gate.

It is an object of the present invention to provide a sensor driver circuit (and pixel circuit and other circuits if necessary) and a photo-sensing element with high performance characteristics by preparing it on an insulating substrate through planer process using only polycrystalline semiconductor material, and also to provide a lost-cost area sensor integrated with driver or an image display unit integrated with a photo-sensor at lower cost by maintaining the manufacturing cost of the driver itself and the manufacturing cost of pixel circuit of the image display unit at a low level.

The sensor driver circuit (and pixel circuit and other circuits if necessary) and a photo-sensing element are manufactured by using polycrystalline silicon film or polycrystalline silicon-germanium film. A diode with a gate using TFT is prepared as the photo-sensing element, and an impurity layer closer to intrinsic layer (the density of activated impurities is $10^{17}$ $cm^{-3}$ or lower) is provided on both sides or on one side of the gate. In so doing, it is possible to maintain or reduce the number of masking processes and the number of photolithographic processes. As a result, a low-cost area sensor integrated with driver or an image display unit integrated with photo-sensing element can be provided by maintaining the manufacturing cost of the driver itself and the manufacturing cost of the pixel circuit of the image display unit on a low level.

According to the present invention, it is possible to provide an area sensor with sensor driver circuit (and pixel circuit and other circuits if necessary) and a photo-sensing element with high performance characteristics prepared on inexpensive insulating substrate. Also, it is possible to provide an image display unit integrated with the photo-sensing element.

To give additional values to the display driven by TFT, it is essential to add higher functions and characteristics. As the means to attain this purpose, the integration or the incorporation of the photo-sensing element is very useful from the viewpoint of the wide scope of functions, which can be added by its use. Further, the area sensor, in which the photo-sensing element is provided in array, is essential and useful in the applications such as devices for medical treatment or for biometrics. In this sense, it is important to manufacture these components at lower cost. As a result, photo-sensing element with high performance characteristics and sensor processing circuit can be prepared on inexpensive glass substrate and the products with high reliability can be manufactured at lower cost.

BRIEF DESCRIPTION OF THE DRAWINGS

FIG. 2 represents cross-sectional drawings, each showing a photo-sensing element of the prior art and a photo-sensing element according to the present invention respectively;

FIG. 3 is a diagram showing the relation between output current and illuminance of the photo-sensing element of the prior art and that of the present invention respectively;

FIG. 4 is a cross-sectional view of a switching element manufactured at the same time as the photo-sensing element of the present invention;

FIG. 5 represents cross-sectional views, each showing another structural example of the photo-sensing element of the present invention;

FIG. 6 (b) represents drawings, each showing manufacturing process of the photo-sensing element and the switching element;

FIG. 6 (c) represents drawings, each showing manufacturing process of the photo-sensing element and the switching element;

FIG. 10 represents equivalent circuit diagrams, each for one pixel of another area sensor;

FIG. 11 represents a rear view, a side view and a front view of an image display unit with the photo-sensing element integrated in it.

DESCRIPTION OF THE PREFERRED EMBODIMENTS

Detailed description will be given below on embodiments of the present invention referring to the attached drawings.

Embodiment 1

Figure 1A:
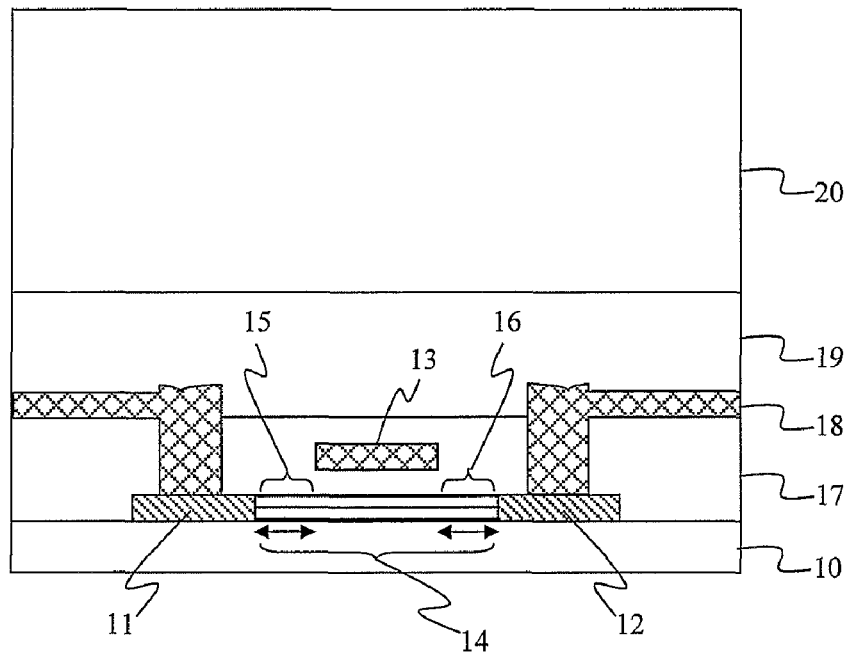
FIG. 1 represents conceptual drawings, each showing a photo-sensing element according to the present invention.
Figure 1B:
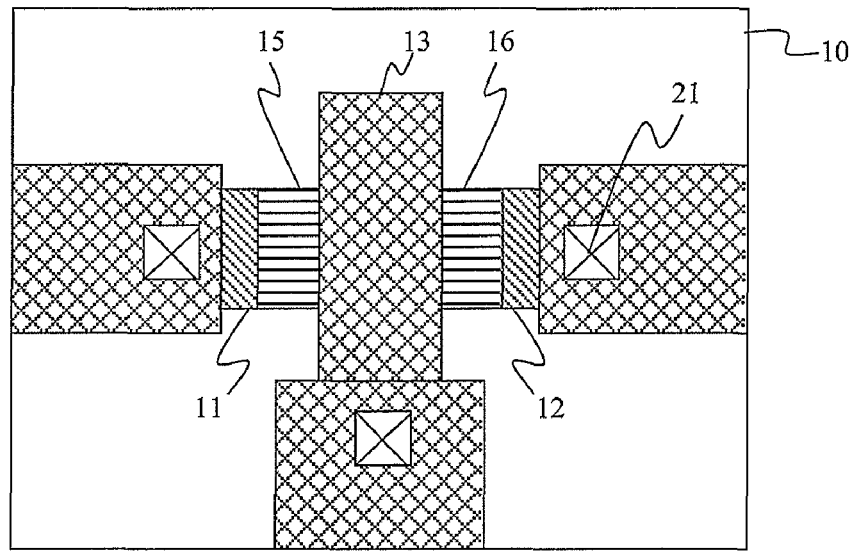
Figure 6A:
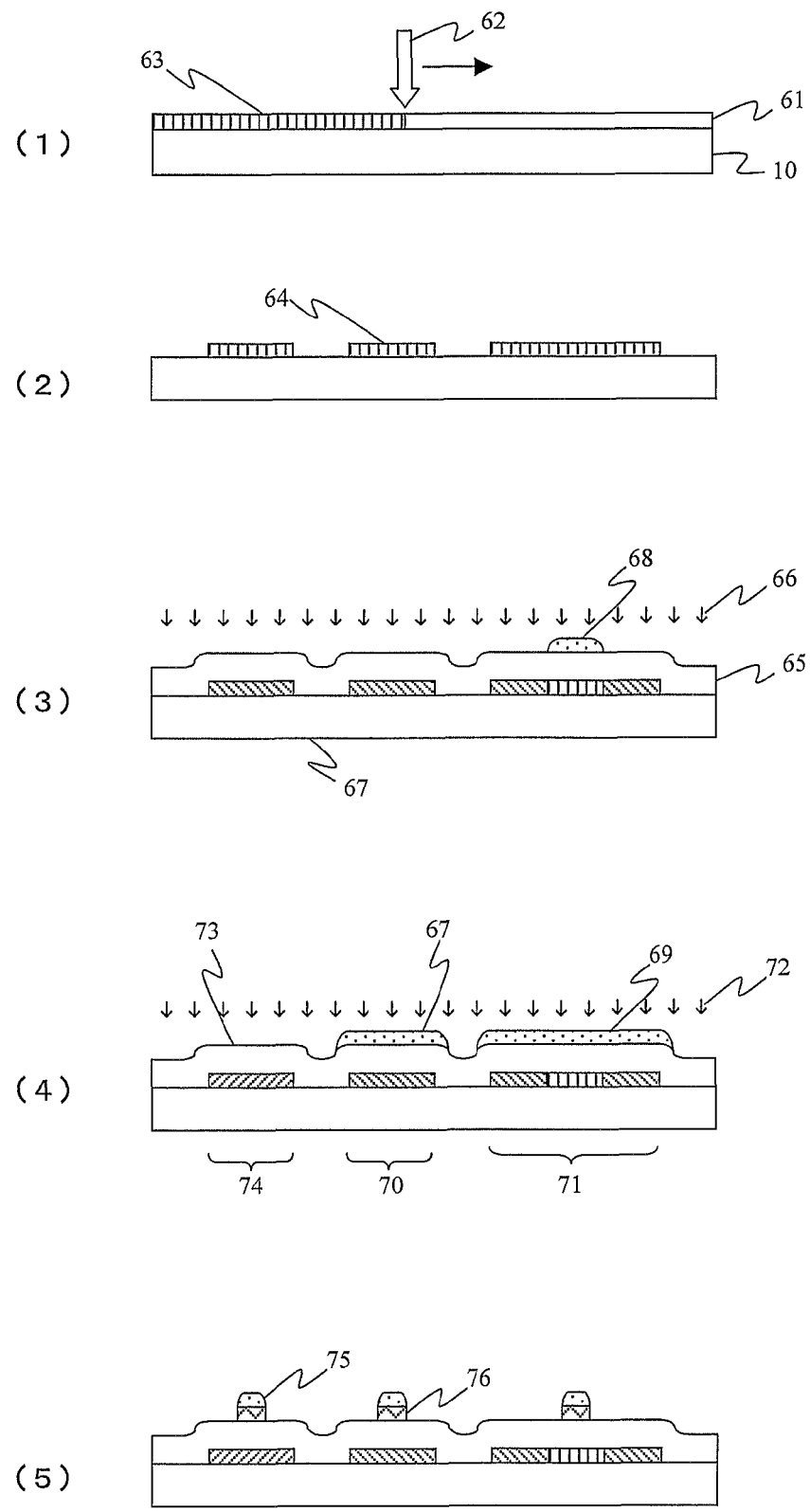
FIG. 6 (a) represents drawings, each showing manufacturing process of the photo-sensing element and the switching element.
Figure 6B:
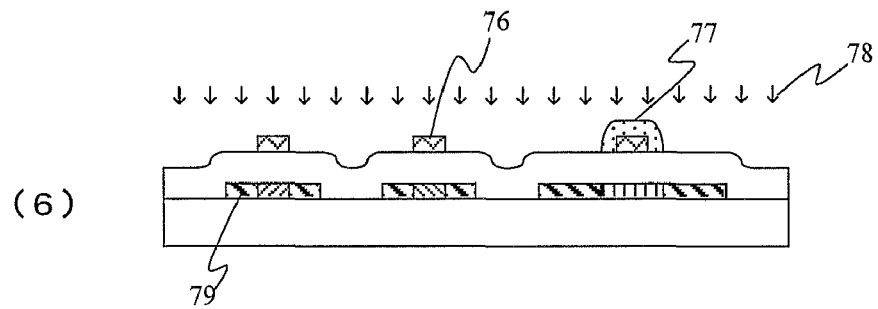
Figure 6B:
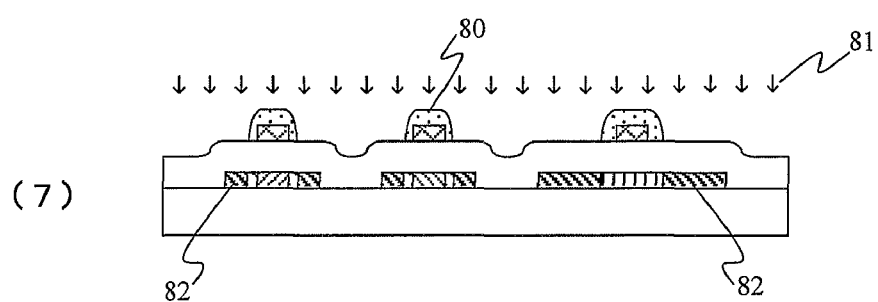
Figure 6B:
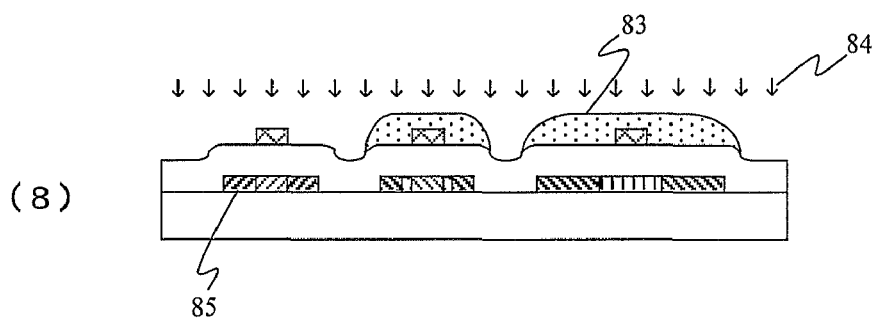
Figure 6B:
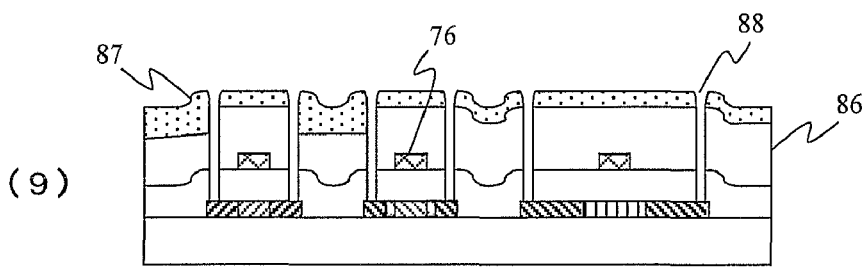
Figure 6C:
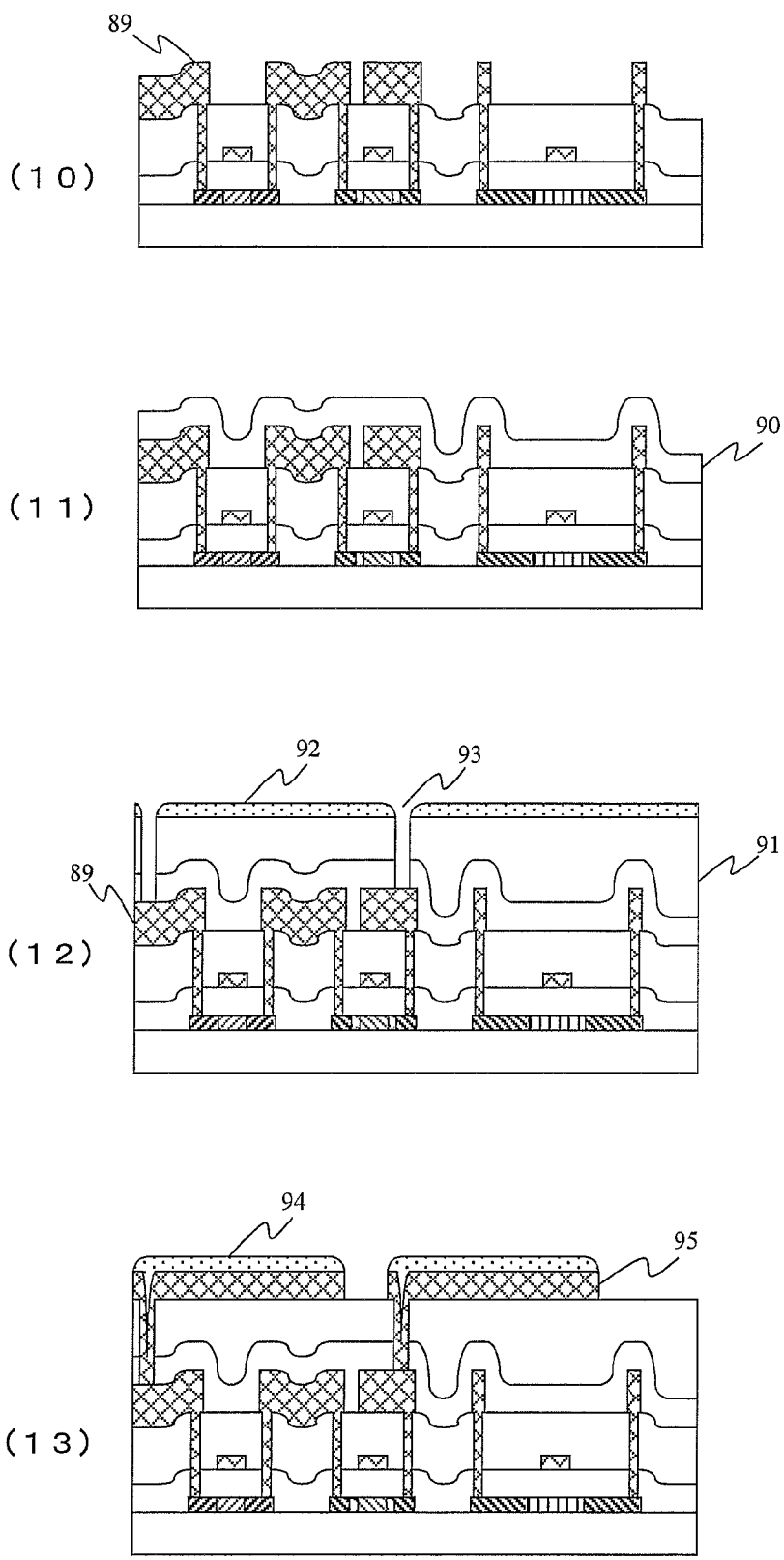

FIG. 1 represents conceptual drawings, each showing a photo-sensing element according to the present invention. FIG. 1 (a) is a cross-sectional view of a photo-sensing element prepared on an insulating substrate, and FIG. 1 (b) is a top view of the photo-sensing element. As shown in FIG. 1, a first electrode 11 and a second electrode 12 are disposed on a first semiconductor layer on an insulating substrate 10 by introducing highly-doped impurities. A photoelectric conversion region 14 prepared by introducing an intrinsic layer or lowly-doped impurities on the first semiconductor layer is disposed between the first and the second electrodes. Above an area of the photoelectric conversion region 14 except a region 15 in contact with the first electrode 11 and except a region 16 in contact with the second electrode 12, a third electrode 13 is arranged via an interlayer insulating film 17. On and above the interlayer insulating film 17, an interconnect 18, an interlayer insulating film 19 and a passivation film 20 connected with the first electrode 11 and the second electrode 12 via a contact hole 21 are provided respectively.

In the first semiconductor layer, a layer between the first electrode 11 and the second electrode 12 is a layer where an intrinsic layer or very lowly-doped impurities (with the density of majority carriers in the semiconductor layer being $1\times10^{17}/cm^3$ or lower under the conditions with no light projected and with no voltage applied) are introduced, and this layer fulfills the function as a photoelectric conversion layer. The functions as electrodes are given to the first electrode 11 and the second electrode 12 by introducing highly-doped impurities (the density of majority carriers in the semiconductor layer being $1\times10^{19}/cm^3$ under the conditions with no light projected and with no voltage applied).

In FIG. 2, a photo-sensing element using a conventional type switching TFT as shown in FIG. 2 (a) is compared with a photo-sensing element according to the present invention as shown in FIG. 2 (b). In FIG. 2, when the photo-sensors are in operation, a depletion region 25 is formed on high voltage side (on the second electrode side in FIG. 2), and an electron-hole pair provided primarily on the depletion layer 25. Therefore, when a light to be detected is projected to the region of the depletion layer 25, considerable effect can be given on the sensitivity of the sensor.

In the photo-sensor using the conventional type TFT, for the purpose of maintaining the reliability of the switching characteristics, a moderately-doped impurity layer 26 is provided between the first electrode 11 and the second electrode 12 on the first semiconductor layer by introducing the impurities of the same type as the first electrode 11 and the second electrode 12 (with the density of majority carriers being in the range from $1\times10^{17}/cm^3$ to $1\times10^{19}/cm^3$). In this case, the depletion layer 25 is disposed below the third electrode 13, and the light coming from above cannot be absorbed when the third electrode 13 is non-transparent to the light to be detected (i.e. when the third electrode 13 does not allow the light to pass).

In contrast, in the photo-sensor according to the present invention, the depletion layer 25 is not covered by the third electrode 13 because it has no moderately-doped impurity layer. Also, in the photo-sensor of the present invention, leakage occurs rarely when the light is not projected because of the photoelectric conversion layer 14. As a result, the sensitivity is increased more in the photo-sensing element of the present invention compared with the conventional type TFT.

FIG. 3 is a diagram to show the relation between output current of photo-sensing elements (i.e. the output of photo-sensing element using the conventional type TFT and the output current of the photo-sensor of the present invention) and illuminance. Each of these photo-sensing elements outputs electric current with a value to match the illuminance. When the values of these outputs are compared with each other, it is found that the output current when external light of 100 lx is projected is increased by 43% compared with the photo-sensing element using the conventional type TFT, and that leakage current (noise) when the light is not projected is decreased by 67%. These results reveal that the sensitivity of the photo-sensing element according to the present invention is higher and it has superior characteristics as the photo-sensing element.

As shown in FIG. 1 (a), when the length of the region 15 in contact with the first electrode 11 in the photoelectric conversion region 14 and the length of the region 16 in contact with the second electrode 12 are longer, the light output is increased more, and the leakage current (noise) when the light is not projected can be reduced. This length is a distance from a line obtained by projecting the end of the third electrode 13 on the first semiconductor layer to each of the first electrode 11 and the second electrode 12 respectively. These are the lengths each shown by arrows in FIG. 1 (a). This length can be maintained to a length of ½ to ¹⁄₁₀ of the scale of the element.

In the photo-sensor integrated with the photo-sensor array or the switching element, the sensor element and the switching element of several μm in scale are prepared. In this case, it is desirable that each of the length of the region 15 in contact with the first electrode 11 and the length of the region 16 in contact with the second electrode 12 is 1 μm or more.

FIG. 4 is a cross-sectional view of a switching element (poly-crystalline silicon TFT) prepared at the same time as the photo-sensor of the present invention. In FIG. 4, it is characterized in that a first electrode (source or drain) 41 of a plurality of switching elements 40 in a photo-sensor driver 50, an active layer region (channel) 44 immediately below a third electrode (gate) 43, a second electrode (drain or source) 42, and the first electrode 11, the second electrode 12 and the third electrode 13, and photoelectric conversion layer 14 of a photo-sensing element 60 are made of polycrystalline silicon film (a first semiconductor film). Because these are made of common material, the manufacturing process can be simplified. At the same time, it is possible to prepare the high-performance switching element 40 by using the polycrystalline silicon TFT, and the high-performance photo-sensing element 60 according to the present invention can be prepared on the same insulating substrate 10 through common manufacturing process. In this case, the regions 15 and 16, which come into contact with the first electrode 11 and the second electrode 12 of the photo-sensing element 60 respectively, are intrinsic layer or very lowly-doped impurity induced layer (the density of majority carriers in the semiconductor layer under the conditions with no light projected or with no voltage applied being $1 \times 10^{17}/cm^3$ or lower). On the other hand, the regions 45 and 46 of the first electrode 41 and the second electrode 42 of the switching element 40 are moderately-doped impurity induced layer of the same type as the first electrode 41 and the second electrode 42 of the photo-sensing element 60 (the density of majority carriers under the conditions with no voltage applied being in the range from $1 \times 10^{17}/cm^3$ to $1 \times 10^{19}/cm^3$).

FIGS. 5 (*a*) and (*b*) each represents a cross-sectional view of another structural example of the photo-sensing element of the present invention. The first electrode 11 and the second electrode 12 are prepared on the first semiconductor layer by introducing highly-doped impurities, and a photoelectric conversion region 14 prepared by introducing intrinsic layer or lowly-doped impurities to the first semiconductor layer is disposed between the first electrode and the second electrode. A third electrode 13 is arranged above the photoelectric conversion region 14 via an interlayer insulating film 17 except a region 16, which comes into contact with the second electrode 12 in the photoelectric conversion region 14. The difference of FIG. 1 (*a*) from FIG. 5 (*a*) and FIG. 5 (*b*) is as follows: In FIG. 1 (*a*), the region 15 in contact with the first electrode 11 and the region 16 in contact with the photoelectric conversion region 14 and the second electrode 12 are made of the same intrinsic layer or the same very lowly-doped impurity induced layer. On the other hand, in FIG. 5 (*a*), the region 15 in contact with the first electrode 11 is a moderately-doped impurity induced layer (the density of majority carriers under the conditions with no light projected and with no voltage applied being in the range from $1 \times 10^{17}/cm^3$ to $1 \times 10^{19}/cm^3$). In FIG. 5 (*b*), the region 15 in contact with the first electrode 11 is a highly-doped impurity induced layer (the density of majority carriers in the semiconductor layer under the conditions with no light projected and with no voltage applied being $1 \times 10^{19}/cm^3$ or more). As explained in connection with FIG. 2, when the sensor is in operation, if a depletion layer 25 is formed on high voltage side (e.g. on the second electrode side), the sensitivity of the sensor can be maintained. Thus, highly sensitive photo-sensing element can be provided even in the structure as shown in FIG. 5 similarly to the first electrode 11 and the second electrode 12. Because resistance between the electrodes is decreased, this is an effective structure in case the photo-sensing element also serves as the switching element.

Next, referring to FIGS. 6 (*a*), (*b*) and (*c*), description will be given on the process to prepare the photo-sensing element and the switching element. First, as shown in FIG. 6 (*a*) (1), an insulating substrate 10 is prepared. Here, an example is given on an inexpensive glass substrate used as the insulating substrate 10, while a plastic substrate typically represented by PET, an expensive quartz substrate or a metal substrate may be used. In case of the glass substrate, sodium, boron, etc. are contained in the substrate, and this may cause contamination to the semiconductor layer. In this respect, it is desirable to deposit an undercoating film such as silicon oxide film or silicon nitride film. On upper surface of it, an amorphous silicon film or a microcrystalline silicon film 61 is deposited by chemical vapor deposition (CVD). Then, excimer laser 62 is irradiated to the silicon film 61 to turn it to polycrystalline, and a polycrystalline silicon film 63 is prepared.

Next, as shown in FIG. 6 (*a*) (2), the polycrystalline silicon film 63 is processed by photolithographic process to prepare a polycrystalline silicon film 64 of island-like shape. Then, as shown in FIG. 6 (*a*) (3), a gate insulating film 65 made of silicon oxide film is deposited by chemical vapor deposition. The material of the gate insulating film 65 is not limited to silicon oxide film, while it is preferable to select a material having high dielectric constant, high insulating property, low fixed charge, low interface trapped charge, low density of trapping state, and high process coordination. By implanting ions 66 to the island-like polycrystalline silicon film via the gate insulating film 65, boron is introduced, and a low density boron injection layer (NE layer) 67 is prepared. In this case, non-injection region of the photoelectric conversion layer of photo-sensing element is determined by a photo-resist 68 in the photolithographic process so that impurities may not be intermingled. In case the photoelectric conversion layer is a very thin impurity induced layer, very lowly-doped impurities are introduced in advance. (As the methods to introduce the impurities, there are: a method to intermingle with impurity gas at the time of deposition, a method to introduce impurities by ion implantation to the polycrystalline silicon film via the gate insulating film, etc., while there is no limitation on the selection of the method.)

Further, as shown in FIG. 6 (*a*) (4), non-injection regions such as an N-type TFT region 70, a photo-sensor region 71, etc. are determined by using a photo-resist 69 in the photolithographic process. By introducing phosphorus through implantation of ions 72, a lowly-doped phosphorus injection layer (PE layer) 73 is prepared at a P-type TFT region 74. The purpose of the use of impurities in the PE layer 73 and the NE layer is to adjust threshold value of TFT. As the dosage at the time of ion implantation, the optimal value is in the range from $1 \times 10^{11}$ cm$^{-2}$ to $1 \times 10^{13}$ cm$^{-2}$. In this case, it is known that the density of majority carriers in the NE layer 66 and the PE layer 72 is in the range from $1 \times 10^{15}$ to $1 \times 10^{17}/cm^3$. The optimal value of boron injection quantity is determined by the threshold value of the N-type TFT, and the optimal value of phosphorus injection quantity is determined by the threshold value of P-type TFT.

Next, as shown in FIG. 6 (*a*) (5), metal film for gate electrode is deposited by CVD or sputtering. The metal film for gate electrode is processed by using photo-resist 75 in the photolithographic process, and a gate electrode 76 is prepared. The metal film for the gate electrode may not necessarily be a metal film. It may be a polycrystalline silicon film prepared by introducing highly-doped impurities with lower resistance.

Next, as shown in FIG. 6 (b) (6), by using a mask used in FIG. 6 (a) (3), ions 78 are injected by using photo-resist 77 in the photolithographic process, and phosphorus is introduced to both sides of the gate electrode 76 of TFT, and a moderately-doped phosphorus injection layer (N-layer) 79 is prepared. This introduction of impurities has the purpose to improve the reliability of the N-type TFT. As the dosage in ion implantation, the optimal value to be injected is between $1\times10^{11}$ cm$^{-2}$ to $1\times10^{15}$ cm$^{-2}$. In this case, the density of majority carriers in the N-layer 79 will be in the range from $1\times10^{15}$/cm$^3$ to $1\times10^{19}$/cm$^3$.

Next, as shown in FIG. 6 (b) (7), a non-injection region is determined by using a photo-resist 80 in the photolithographic process. By implanting ions 81 to electrode regions of TFT and of the photo-sensor, phosphorus is introduced, and a highly-doped phosphorus injection layer (N+ layer) 82 is prepared. The dosage of phosphorus in the ion implantation layer is preferably $1\times10^{15}$ cm$^{-2}$ or more because it is necessary to sufficiently decrease the resistance of the electrode. In this case, the density of majority carriers in the N+ layer can be $1\times10^{19}$/cm$^3$ or higher.

Next, as shown in FIG. 6 (b) (8), a non-injection region of the N-type TFT and the photo-sensor are determined by using a mask used in FIG. 6 (a) (4) and by using a photo-resist 83 in the photolithographic process. By implanting ions 84 to the electrode region of the P-type TFT, boron is introduced, and a highly-doped boron injection layer (P+ layer) 85 is prepared. The dosage at the time of ion implantation is preferably $1\times10^{15}$ cm$^{-2}$ or more because the resistance of the electrode must be sufficiently decreased. In this case, the density of majority carriers in the P+ layer will be $10^{19}$/cm$^3$ or more. By the processes as described above, electrodes for TFT and photo-sensor can be prepared.

In this embodiment, care must be taken that boron in the same quantity as in the NE layer 67 is introduced into the PE layer 73, and that phosphorus in the same quantity of the N+ layer is introduced into the P+ layer. These are the impurities, which are not initially needed. For the purpose of maintaining the type of majority carriers of TFT and the photo-sensor, it is necessary to introduce phosphorus and boron in such quantities as to offset each other into each of the layers.

In the present embodiment, it is advantageous in that the photolithographic process can be simplified and the use of photo-masks can be eliminated, while it is disadvantageous in that many defects occur in the active layer of the P-type TFT. In case the characteristics of the P-type TFT cannot be maintained, it is desirable to increase the number of photo-masks used and the number of the photolithographic processes to block the introduction of the impurities, which need not be introduced, by covering the PE layer 73 and the P+ layer 85.

Next, as shown in FIG. 6 (b) (9), an interlayer insulating film 86 is deposited above the gate electrode 76 by CVD using TEOS (tetraethoxy silane) as raw material. Then, annealing is performed for activation of the introduced impurities. Next, a contact hole 88 is prepared on electrode portion by using photo-resist 87 in the photolithographic process. The interlayer insulating film 86 is used to insulate the interconnects as prepared later from the gate electrode of the lower layer and polycrystalline semiconductor layer. In this respect, any type of film may be used so far as it has insulating property. However, parasitic capacitance must be reduced, and it is desirable to use a material, which has low specific dielectric constant and low film stress so that it has good process coordination to the thickening of the film. Further, to be compatible with display function, the transparency of the film is important, and it is desirable to use a material, which has high transmittance to the visible light. In the present embodiment, silicon oxide film using TEOS gas as raw material is used as an example.

Next, as shown in FIG. 6 (c) (10), the materials for interconnects are deposited, and interconnects 89 are prepared by the photolithographic process. Further, as shown in FIG. 6 (c) (11), a passivation film 90 is prepared by CVD. If necessary, after the passivation film 90 is prepared, additional annealing is performed to improve the characteristics of TFT. Any type of film may be used so far as it has insulating property as in the case of the interlayer insulating film 86. If necessary, as shown in FIG. 6 (c) (12), a flattened insulating film 91 is prepared by using an insulating layer formed with paste method or insulating resistant material. Then, by using a photo-resist 92 in the photolithographic process, a contact hole 93 is formed for the contact between the interconnects 89 and ITO in the subsequent process.

Next, as shown in FIG. 6 (c) (13), a transparent electrode film such as ITO is prepared. Then, using a photo-resist 94 in the photo-lithographic process, a transparent electrode 95 is prepared. Then, a passivation film is prepared on it if necessary, and a contact can be provided in the photolithographic process.

Figure 7:
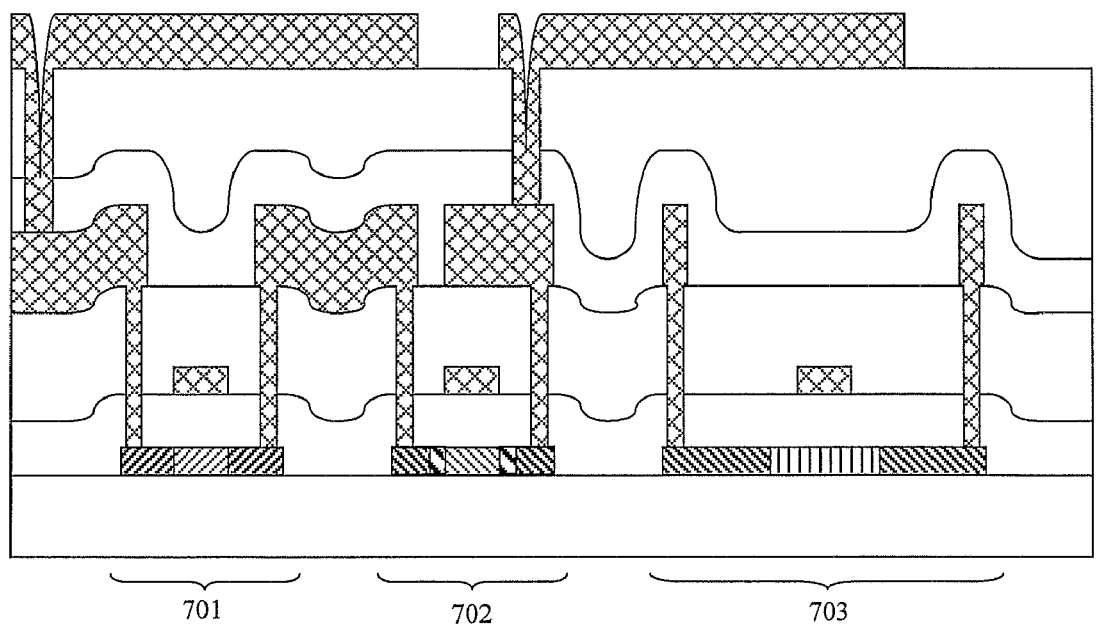
FIG. 7 is a cross-sectional view of the photo-sensing element and the switching element (P-type TFT and N-type TFT)

FIG. 7 shows an example of a P-type TFT 701, an N-type TFT 702 and a photo-sensing element 703 as prepared in the present embodiment. Here, a photo-sensing element as shown in FIG. 1 (a) is prepared. By the processes described in the present embodiment, the TFT to constitute the circuit, and the photo-sensing element of all of the structures shown in FIG. 5 can be prepared at the same time.

Figure 8A:
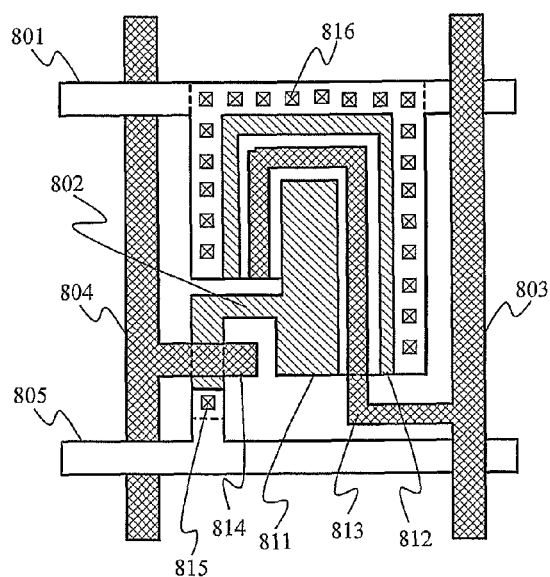
FIG. 8 represents a layout drawing, a cross-sectional view and an equivalent circuit diagram of one pixel of an area sensor.
Figure 8B:
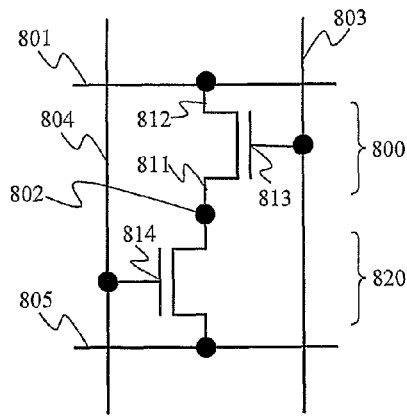
Figure 8C:
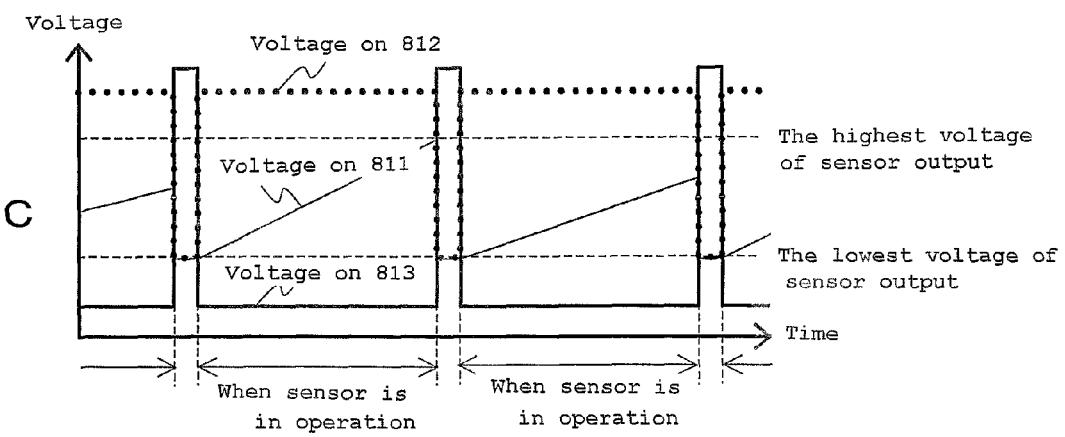

FIGS. 8 (a), (b) and (c) represent a layout of one pixel of an area sensor using a photo-sensor TFT according to the present invention, its equivalent circuit diagram and an operation timing chart respectively. In FIG. 8, the voltage of a bias line 801 (a second electrode 812) of a photo-sensor TFT 800 is set to a value lower than the voltage of a sensor node 802 (a first electrode 811 of the photo-sensor TFT 800), and the voltage of a sensor gate line 803 (a third electrode 813 of the photo-sensor TFT 800) is set to a higher value, and voltage of the sensor node 802 (the first electrode 811) is reset. When the sensor is in operation, the voltage of the bias line 801 (the second electrode 812) is set to a value considerably higher than the voltage of the sensor node 802 (the first electrode 811), and the voltage of the sensor gate line 803 (the third electrode 813) is decreased. In this case, the photo-sensor TFT 800 is in "off" state, and only very slight electric current flows to the photo-sensor TFT 800. When light is projected to the photo-sensor TFT 800, more electric current flows than the time when light is not projected, and the voltage of the sensor node (the first electrode 811) is increased. When voltage is applied on a gate electrode 814 of a switching TFT 820 from the gate line 804 at a certain time, electric charge proportional to the illuminance of incident light is given to the data line 805, and the voltage on the data line 805 is increased. This voltage is read by a sensor driver, which is provided outside the region of the area sensor. The electric charge accumulated on the sensor node 802 (the first electrode 811) is maintained by parasitic capacitance, and auxiliary storage capacitance may be added if necessary. The sensor operation time should be set so that the voltage of the sensor node 802 (the first electrode 811) does not exceed the voltage of the bias line 801 (the second electrode 812). In this case, accumulated electric charge on the sensor node 802 is proportional to illuminance. Reference numeral 815 in FIG. 8 (a) represents a contact hole to connect the data line 805 to the first electrode (or the second electrode) of the switching TFT 820, and the numeral 816 denotes a contact hole to connect the bias line 801 to the second electrode 812 of the photo-sensor TFT 800.

Figure 9A:
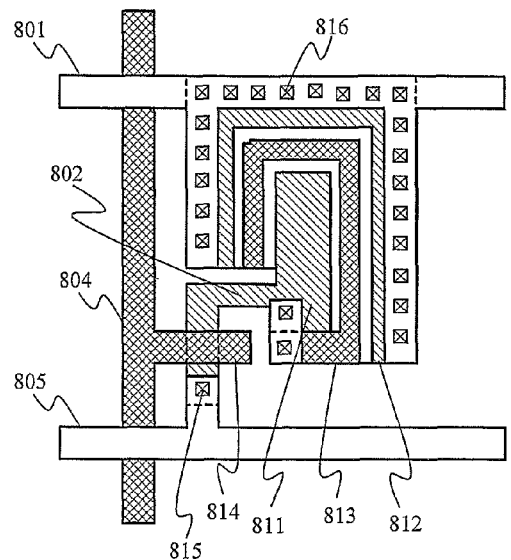
FIG. 9 represents a layout drawing, a cross-sectional view and an equivalent circuit diagram of one pixel of another area sensor.
Figure 9B:
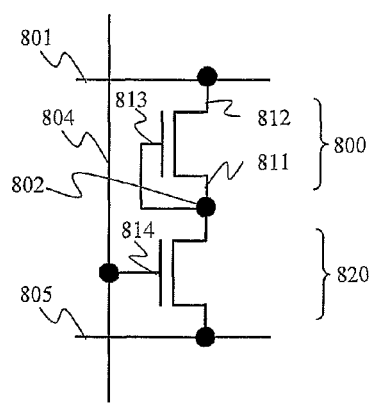
Figure 9C:
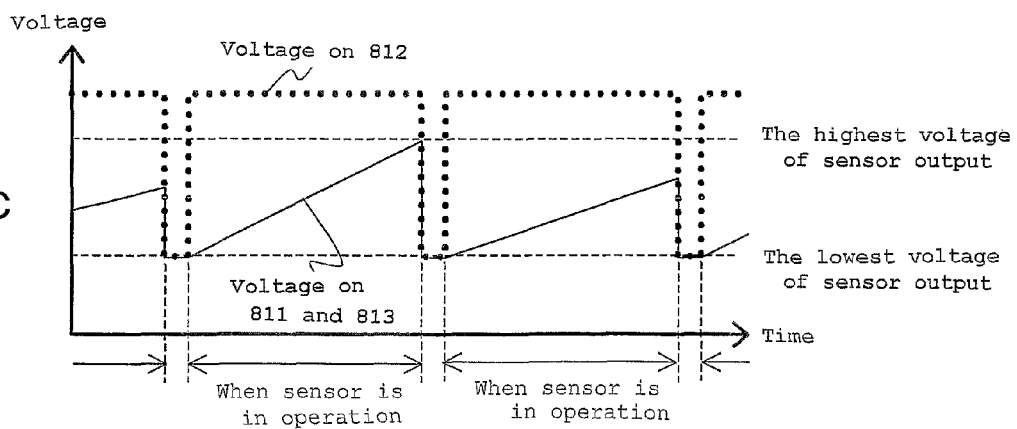
Figure 12A:
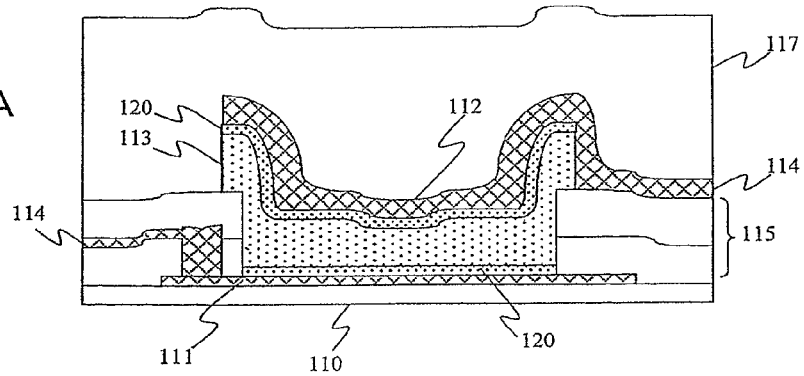
FIG. 12 represents cross-sectional views, each showing a conventional type photo-sensing element.
Figure 12B:
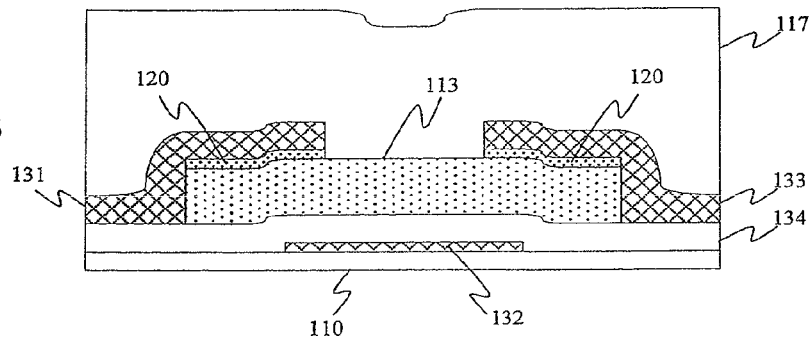

FIGS. 9 (*a*), (*b*) and (*c*) represent another example of a layout drawing of one pixel of an area sensor using a photo-sensor TFT according to the present invention, its equivalent circuit diagram, and an operation timing chart respectively. In this example, it is characterized in that the third electrode 813 of the photo-sensor TFT 800 and the first electrode 811 are short-circuited. In FIG. 9, the voltage of the bias line 801 (the second electrode 812) is set to a lower value than the voltage of the sensor node 802 (the first electrode 811 and the third electrode 813) before the operation of the sensor, and the voltage on the sensor node 802 is reset. When the sensor is in operation, the voltage of the bias line 801 (the second electrode 812) is set to a value considerably higher than the voltage on the sensor node 802. In this case, the photo-sensor TFT 800 is in "off" state, and only very slight electric current flows to the photo-sensor TFT 800. When light is projected to the photo-sensor TFT 800, more electric current than that of the time when light is not projected flows, and the voltage on the sensor node 802 is increased. When voltage is applied on the gate electrode 814 of the switching TFT 820 from the gate line 804 at a certain time and the switching TFT 820 is set into operation, electric charge proportional to the illuminance of incident light is given to the data line 805, and the voltage of the data line 805 is increased. This voltage is read by a sensor driver provided outside the region of the area sensor. The electric charge accumulated on the sensor node 802 is maintained by parasitic capacitance similarly to the case of FIG. 8, and auxiliary storage capacitance may be added if necessary. Sensor operation time should be set so that the voltage of the sensor node 802 (the first electrode 811 and the third electrode 813) does not exceed the voltage of the bias line 801 (the second electrode 812). In this case, the accumulated electric charge on the sensor node 802 is proportional to the illuminance.

FIG. 10 shows another example of equivalent circuit diagram of one pixel of an area sensor using the photo-sensor TFT according to the present invention. FIG. 10 (*a*) shows that the third electrode 813 of the photo-sensor TFT 800 can be controlled by an independent line. In FIG. 10 (*b*), the third electrode 813 of the photo-sensor TFT 800 is short-circuited to the first electrode 811. In FIG. 10, the voltage of the bias line 801 (the second electrode 812) is set to a value lower than the voltage of the sensor node 802, and the voltage on the sensor node 802 is reset. When the sensor is in operation, the voltage of the bias line 801 (the second electrode 812) is set to a value considerably higher than the voltage on the sensor node 802. In this case, only very slight electric current flows to the photo-sensor TFT 800 due to rectifying effect. When light is projected to the photo-sensor TFT 800, more electric current flows than the time when light is not projected, and the voltage on the sensor node 802 is increased. In this case, the voltage on the data line 805 is set to a value lower than the voltage on the gate line 804 in advance (or it may be set reversely). When the voltage on the sensor node 802 reaches a value higher than the sum of the voltage of the data line 805 (the voltage of the gate line in reverse case) and the threshold value of the switching TFT 820, the switching TFT 820 is turned to "on" state, and the voltage on the data line 805 reaches. The voltage approximately equal to the voltage on the gate line 804. The change of the voltage is read by the sensor driver, which is provided outside the region of the area sensor. Therefore, if the switching TFT 820 can be turned on within the operation time of the sensor, signal can be outputted regardless of the illuminance. As a result, by changing the sensor operation time, gray scale can be detected.

Embodiment 2

The sensors applied in FIG. 8, FIG. 9 and FIG. 10 may be any of the sensors shown in FIG. 1 (*a*) and FIGS. 5 (*a*) and (*b*). However, FIGS. 5 (*a*) and (*b*) are asymmetrical, and care must be taken on the arrangement of the electrodes. In these figures, examples of the area sensors are shown. If pixel circuits are arranged for each pixel at the same time as the sensor, an image display unit with photo-sensor functions can be provided. Signal line to send signal to pixel, gate line, etc. may be added newly. Or, the bias line, the data line or the gate line may be used in common by adjusting the timing of signal line.

FIG. 11 represents schematical drawings of an image display unit integrated with the photo-sensing element of the present invention. FIG. 11 (*a*) is a rear view of an image display unit. On a glass substrate 101, a printed board 103 for driver LSI comprising a driver LSI 102 is disposed. Via an FPC 104, a plurality of pixels formed on the front side of the image display unit are driven. FIG. 11 (*b*) is a side view of the image display unit. On front side of the image display unit, a photo-sensor 105 comprising the photo-sensing element of the present invention and a plurality of pixels 106 arranged on an image display region are disposed. FIG. 11 (*c*) is a front view of the image display unit. On a glass substrate 101, a peripheral driver circuit 107 for driving pixels 106, a photo-sensor driver processing circuit 108 for processing the output of the photo-sensor 105, a backlight, and other control circuits 109 are disposed.

In FIG. 11, sensor signals to correspond to external light from the photo-sensor 105 are processed by the photo-sensor driver processing circuit 108, and the signals are sent to the peripheral driver circuit 107, which drives the pixels 106. At the peripheral driver circuit 107, image quality such as luminance, contrast, etc. of the image display unit are controlled, depending on the sensor signals.

In FIG. 11, a part of the driver is composed of LSIs and these are mounted on rear surface via FPC. To meet the required performance characteristics, TFT arranged on the glass substrate can be used sequentially. In so doing, LSIs and the cost for mounting them can be reduced, and the decrease of mechanical reliability due to the mounting can be avoided. Also, the driver can be designed at the time of the designing of pixels, and this facilitates the customization of the components. According to the present invention, the sensor and its driver can be integrated on the glass substrate, and this makes it possible to arrange and mount the sensor and processing circuits at any desired position in compact arrangement.

What we claim is:

1. A photo-sensing device, comprising a photo-sensing element and a switching element provided on an insulating substrate, wherein:
    said photo-sensing element comprises:
        a first electrode and a second electrode prepared by introducing phosphorous at a first density on a semiconductor layer,
        a photoelectric conversion region prepared by introducing phosphorous at a second density, lower than said first density on said semiconductor layer disposed between said first electrode and said second electrode, and
        a third electrode disposed above said photoelectric conversion region via an insulating film,
        wherein said third electrode is disposed via said insulating film above all of the photoelectric conversion region except a region of the photoelectric conversion region in contact with said second electrode, and said switching element comprises:

a fourth electrode and a fifth electrode prepared by introducing phosphorous at a third density on said semiconductor layer, an active region (channel) prepared by introducing phosphorous at a fourth density lower than said third density on said semiconductor layer disposed between said fourth electrode and said fifth electrode, a moderately doped layer prepared by introducing phosphorous at a fifth density, lower than said third density, on said semiconductor layer disposed between said fourth electrode and said active region (channel), and between said fifth electrode and said active region (channel), and a sixth electrode disposed above said active region (channel) via an insulating film.

2. A photo-sensing device according to claim 1, wherein:

said first density of phosphorous is $1\times10^{19}/cm^3$ or higher and said second density of phosphorous is $1\times10^{17}/cm^3$ or lower.

3. A photo-sensing device according to claim 1, wherein:

when the photo-sensing device comprising said photo-sensing element is in operation, the voltage applied on the second electrode is higher than the voltage on the first electrode, and the voltage applied on the third electrode is lower than the voltage applied on the first electrode.

4. A photo-sensing device according to claim 1, wherein:

when the photo-sensing device comprising said photo-sensing element is in operation, the voltage applied on the second electrode is higher than the voltage on the first electrode and on the third electrode.

5. A photo-sensing device according to claim 1, wherein:

the third electrode of said photo-sensing element is disposed via the insulating film above a region of the photoelectric conversion region in contact with the first electrode.

6. A photo-sensing device, comprising a photo-sensing element and a switching element provided on an insulating substrate, wherein:

said photo-sensing element comprises:

a first electrode and a second electrode prepared by introducing phosphorous at a first density on a semiconductor layer, a photoelectric conversion region prepared by introducing phosphorous at a second density, lower than said first density, on said semiconductor layer disposed between said first electrode and said second electrode, and a third electrode arranged above said photoelectric conversion region, wherein for decreasing resistance between the first and second electrodes, said third electrode to be disposed above said photoelectric conversion region in contact with said first electrode via an insulating film, but not above a region of the photo-electric conversion region in contact with the second electrode, and wherein said switching element comprises:

a fourth electrode and a fifth electrode prepared by introducing phosphorous at a third density on said semiconductor layer, an active region (channel) prepared by introducing phosphorous at a fourth density, lower than said third density, on said semiconductor layer disposed between said fourth electrode and said fifth electrode, a moderately doped layer prepared by introducing phosphorous at density lower than said third density, and higher than said fourth density on said semiconductor layer disposed between said fourth electrode and said active region (channel), and between said fifth electrode and said active region (channel), and a sixth electrode disposed above said active region (channel) via an insulating film.

\* \* \* \* \*